(12) United States Patent
Korenstein et al.

(10) Patent No.: US 8,450,185 B2
(45) Date of Patent: May 28, 2013

(54) SEMICONDUCTOR STRUCTURES HAVING DIRECTLY BONDED DIAMOND HEAT SINKS AND METHODS FOR MAKING SUCH STRUCTURES

(75) Inventors: Ralph Korenstein, Framingham, MA (US); Mary K. Herndon, Littleton, MA (US); Chae Deok Lee, Acton, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/470,749

(22) Filed: May 14, 2012

(65) Prior Publication Data
US 2012/0225536 A1 Sep. 6, 2012

Related U.S. Application Data

(62) Division of application No. 12/971,224, filed on Dec. 17, 2010.

(51) Int. Cl.
*H01L 21/30* (2006.01)

(52) U.S. Cl.
USPC ............ 438/458; 438/479; 438/462; 438/122

(58) Field of Classification Search
USPC .................. 438/479, 462, 122, 458
See application file for complete search history.

(56) References Cited

U.S. PATENT DOCUMENTS

| | | | |
|---|---|---|---|
| 6,400,742 B1 * | 6/2002 | Hatakoshi et al. | 372/46.01 |
| 6,946,363 B2 * | 9/2005 | Davidson | 438/455 |
| 7,015,117 B2 * | 3/2006 | Urbanek | 438/458 |
| 7,122,095 B2 * | 10/2006 | Letertre et al. | 156/701 |
| 2009/0020842 A1 * | 1/2009 | Shiau et al. | 257/459 |
| 2010/0068503 A1 * | 3/2010 | Neogi et al. | 428/323 |
| 2011/0024767 A1 * | 2/2011 | Sung | 257/77 |

* cited by examiner

*Primary Examiner* — Kimberly Rizkallah
*Assistant Examiner* — Timor Karimy
(74) *Attorney, Agent, or Firm* — Daly, Crowley, Mofford & Durkee, LLP

(57) ABSTRACT

A semiconductor structure is bonded directly to a diamond substrate by Van der Waal forces. The diamond substrate is formed by polishing a surface of diamond to a first degree of smoothness; forming a material, such as diamond, BeO, GaN, MgO, or $SiO_2$ or other oxides, over the polished surface to provide an intermediate structure; and re-polishing the material formed on the intermediate structure to a second degree of smoothness smoother than the first degree of smoothness. The diamond is bonded to the semiconductor structure, such as GaN, by providing a structure having bottom surfaces of a semiconductor on an underlying material; forming grooves through the semiconductor and into the underlying material; separating semiconductor along the grooves into a plurality of separate semiconductor structures; removing the separated semiconductor structures from the underlying material; and contacting the bottom surface of at least one of the separated semiconductor structures to the diamond substrate.

12 Claims, 4 Drawing Sheets

SEMICONDUCTOR STRUCTURES HAVING DIRECTLY BONDED DIAMOND HEAT SINKS AND METHODS FOR MAKING SUCH STRUCTURES

CROSS REFERENCE TO RELATED APPLICATION

This application is a divisional of and claims the benefit of application Ser. No. 12/971,224 filed Dec. 17, 2010.

TECHNICAL FIELD

This disclosure relates generally to semiconductors structures having directly bonded diamond heat sinks and methods for making such structures.

BACKGROUND

As is known in the art, diamond has been used as a heat spreader to remove the heat generated by high power semiconductor devices. Usually the diamond is bonded to the semiconductor chip via a metal solder or other adhesive. The semiconductor junction, where most of the heat is generated, is typically located a fair distance away from the diamond heat spreader and thus heat removal is not efficient. More particularly, processes have been developed for bonding GaN to diamond; however an interlayer is used between the GaN and the diamond. The interlayer is another thermal barrier that limits the ability of the diamond to effectively conduct heat away from the GaN epilayer. For example, in one method, a thin Si layer (~10-20 μm thick) is used as the interlayer and in another process an oxide "glue" layer ~10000 Å is used as the interlayer.

SUMMARY

In accordance with the disclosure, a semiconductor body is bonded directly to a diamond substrate. With such structure, heat removal from the semiconductor structure GaN is substantially improved.

In one embodiment the semiconductor body comprises a GaN epitaxial layer and wherein the epitaxial layer is directly bonded to the diamond substrate.

In one embodiment, a structure is provided comprising: a layer of diamond having a surface with peaks and valleys; and a second material disposed only in the valleys to provide the structure with a surface having: the peaks of the diamond layer; and, surface portions of the second material disposed in the valley.

In one embodiment, a second layer of semiconductor material bonded directly to the surface of the aforementioned structure.

In one embodiment, the major portion of the surface of the aforementioned structure is diamond.

In one embodiment, at least 80 percent of the surface of the aforementioned structure is diamond.

In one embodiment, the second material is diamond.

In one embodiment, the aforementioned second layer of semiconductor material is bonded directly to the surface of the structure by Van der Wall forces.

In one embodiment, the second material is a solid material.

In one embodiment, a structure is provided comprising: a layer of diamond and a second layer of semiconductor material bonded directly to the surface of the diamond.

In one embodiment, the semiconductor material is GaN.

In accordance with the disclosure, the GaN epitaxial layer is directly bonded to the diamond heat conductor using only Van De Waals forces which results in more efficient heat conduction away from the junction and improved heat dissipation.

In one embodiment, a method is provided for forming a structure, such method comprising: polishing a surface of diamond to a first degree of smoothness; forming a material over the polished surface to provide an intermediate structure; re-polishing the material formed on the intermediate structure to a second degree of smoothness smoother than the first degree of smoothness.

In one embodiment, the formed material is diamond.

In one embodiment, the formed material is a thermally conductive oxide.

In one embodiment, the formed material is BeO, GaN, MgO, or $SiO_2$.

In one embodiment, a method a method is provided for bonding a semiconductor to a heat sink, comprising: providing a structure comprising: a semiconductor layer having a bottom surface disposed on an underlying material; forming grooves through the semiconductor layer and into the underlying material; separating the semiconductor layer along the grooves into a plurality of separate semiconductor structures; removing the separated semiconductor structures from the underlying material; and contacting the bottom surface of at least one of the separated semiconductor structures to a heat sink.

In one embodiment, the semiconductor structures are GaN structures.

In one embodiment, the heat sink is diamond.

In one embodiment, the contacting is performed under a liquid.

In one embodiment the liquid is a volatile liquid.

In one embodiment the liquid is water.

In one embodiment the liquid evaporated after the contacting.

In on embodiment, the semiconductor structure is bonded to the diamond by Van der Waals forces.

In one embodiment, a method is provided for bonding a semiconductor to a diamond substrate, comprising: providing a structure comprising a GaN epitaxial layer having a bottom surface disposed on an underlying layer; forming grooves through the GaN and into the underlying layer; separating the GaN along the grooves into a plurality of separate structures; removing the separated GaN structures from the underlying layer; and contacting the bottom surface of at least one of the separated GaN structures to a diamond substrate.

Thus, with such disclosure, a semiconductor surface is bonded directly to diamond without the use of any adhesives or interlayer. Further, contacting between the GaN and diamond surface under water facilitates the formation of strong Van der Waals bonding.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
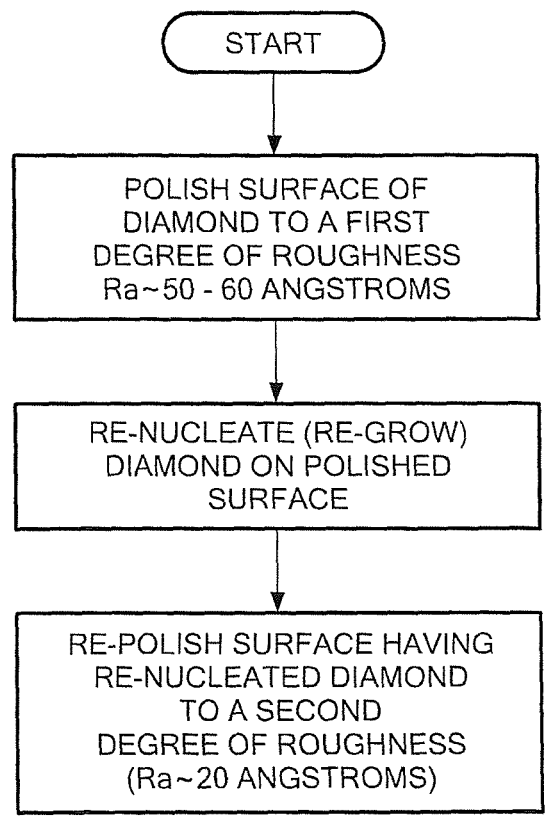
FIG. 1 is a diagram showing steps in a process used to form a diamond substrate in accordance with the disclosure.
Figure 1A:
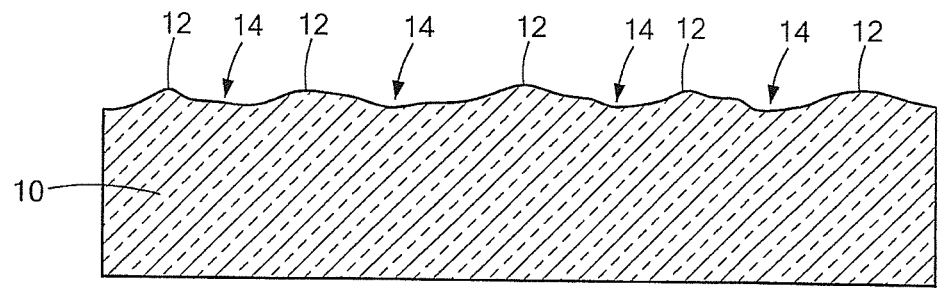
FIGS. 1A-1C are sketches of the diamond substrate at various stags in the fabrication thereof.

Referring now to FIG. 1, a process is shown for forming a diamond heat sink. First, a first diamond body 10 (FIG. 1A) is formed using, for example, any conventional plasma deposition process. The upper surface of the first diamond body 10 is polished using a conventional diamond suspension process, here polished to a degree of smoothness in the order of an Ra of between approximately 50-60 Angstroms. It is noted that even after the polishing, the upper surface of the body has peaks 12 and valleys 14.

Figure 1B:
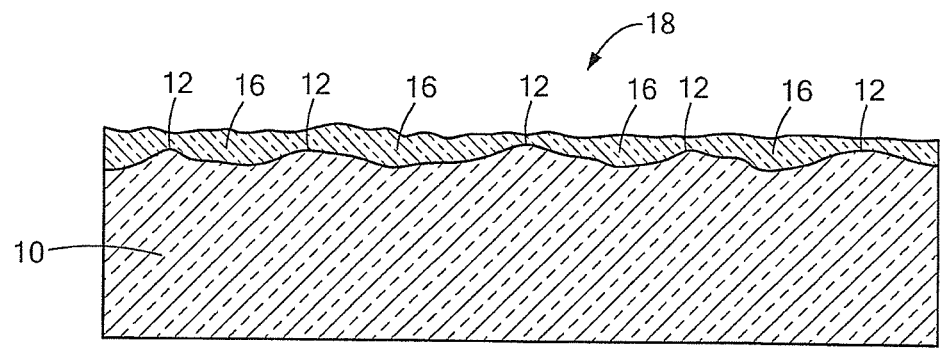

Next, material 16 (FIG. 1B), here for example, additional diamond is grown on the polished diamond using the same plasma deposition process used to form the first diamond body 10, thereby forming a second diamond body 18. More particularly, the additional diamond is formed by re-nucleation. This is performed by bias enhanced nucleation (BEN). Thus, the process does not merely grow more diamond on top of the structure 12 but rather takes advantage of diamond re-nucleation to allow additional diamond to grow everywhere on the polished diamond surface including inside voids and crevices.

Figure 1C:
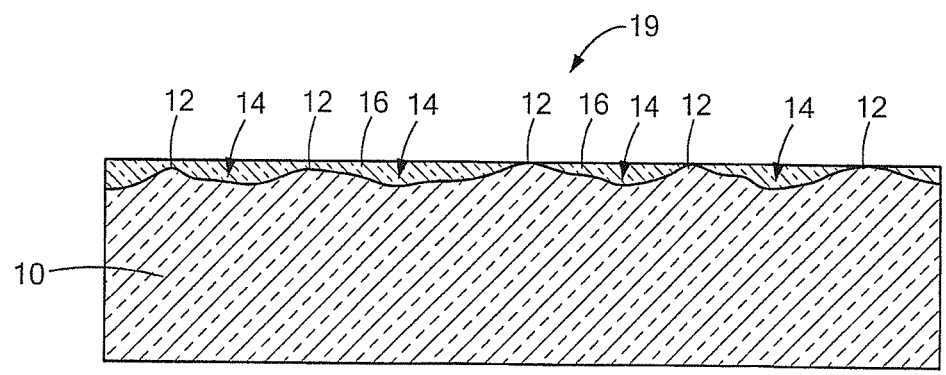

Next, the upper surface of the body 18 (FIG. 1B) is re-polished to a second degree of smoothness (here for example, to an Ra of approximately 20 Angstroms) smoother than the first degree of smoothness to form body 19 (FIG. 1C). The resulting surface is an optically polished surface. It is noted that the additional material 16 may be, for example, BeO, GaN, MgO, or $SiO_2$ or other oxides with reasonable thermal conductivity. Thus, the structure 19 comprises a layer of diamond 10 having a surface with peaks 12 and valleys 14 and the second material 16 disposed only in the valleys 14 to provide the structure 19 with a surface having: the peaks 12 of the diamond layer 10 and, surface portions of the second material 16 disposed in the valleys 14. Here, at least 80 percent of the surface is the peaks 12.

Figure 2:
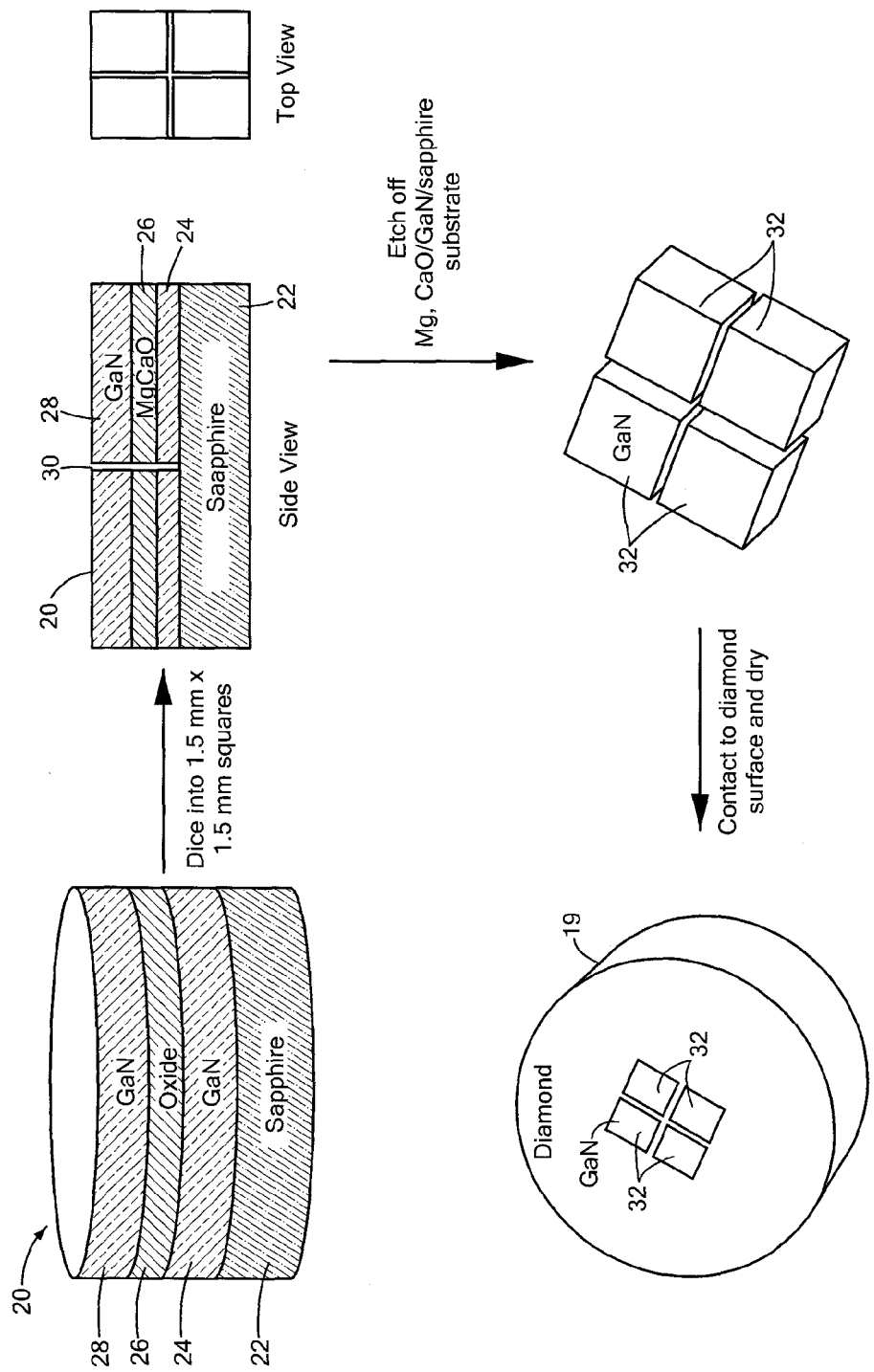
FIG. 2 is a diagram showing steps in a process used to bond a semiconductor directly to the diamond substrate formed in accordance with the process steps of FIG. 1 in accordance with the disclosure.

Next, referring to FIG. 2, a process is shown for directly bonding a semiconductor to the optically polished upper surface of the body 19 by Van der Waals forces. First, a composite substrate 20 is provided having a lower layer 22 of sapphire, a 2.5 micrometers thick layer 24 of GaN on the sapphire 22, a (Mg,Ca)O layer 26, here 0.3 to 0.5 micrometers thick, and a second, upper, epitaxially formed (1 to 5 micrometers thick) layer 28 of GaN on the (Mg,Ca)O layer 26. The substrate 20 may be purchased from the University of Florida, Gainesville, Fla., see a paper entitled "Improved oxide passivation of AlGaN/GaN high mobility transistors" by Gila et al. Applied Physics Letters 87, 1635303 (2005).

More particularly, a handle wafer, not shown, which could be Silicon or glass, is bonded with glue to the top of the GaN layer 28. Next, grooves 30 are mechanically cut with a saw blade through the semiconductor layer 28 and through layer 26 into layer 24, as shown. Next, a dilute (10%) phosphoric acid solution is used to separate the semiconductor layer 28 into a plurality of separate semiconductor structures 32. More particularly, the etch undercuts under the lower surface of the epitaxial layer 28 and along the interface between the epitaxial layer 28 and the (Mg,Ca)O layer 26 thereby separating (i.e., removing) the separated semiconductor structures 32 from the underlying material, i.e., layer 26. Here, the separated structures 32 are small squares ~2 mm×2 mm to facilitate (i.e., reduce the etching time) in the undercutting by the phosphoric acid—otherwise it would take a very long time for the acid to work its way through large areas.

Figure 3:
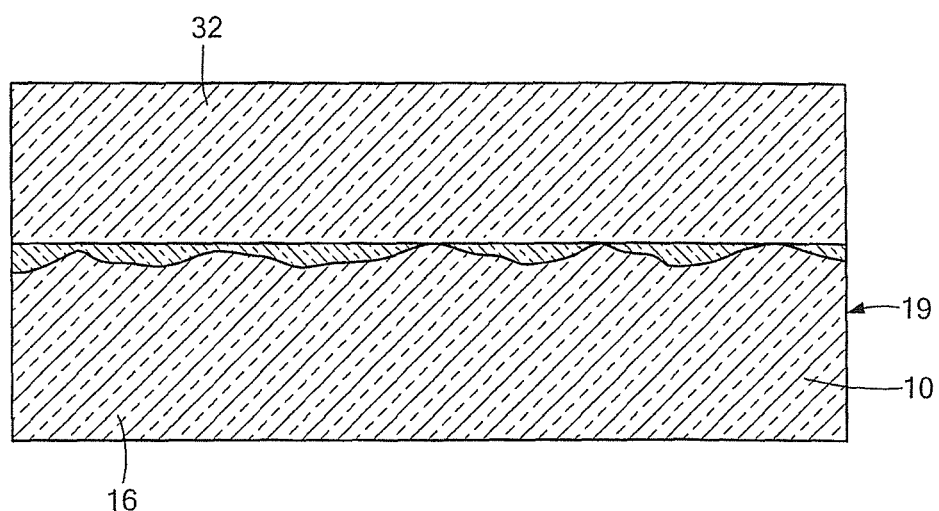
FIG. 3 is a sketch of the diamond substrate directly bonded to the semiconductor.

Next, the bottom surfaces of the separated semiconductor structures 32 are contacted to the smoothed upper surface of the diamond structure 19 formed in accordance with the process described above in connection with FIG. 1. It is noted that the bottom surface of the structures 32 and the upper surface of structured 18 are brought together under water. Alternatively, a few water droplets are placed between the surfaces to be bonded. Next, the handle is then removed after attachment to diamond is complete. Any remaining water being evaporated resulting in a bond process wherein Van der Waals attractive forces are developed between optically contacted (i.e., extremely smooth) surfaces. The resulting bonded structure is shown in FIG. 3. Once the bonding steps are completed the handle wafer is removed from the top of the GaN layer 28 by means of organic solvents.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A method for bonding a semiconductor to a diamond substrate, comprising:
   providing a structure comprising a GaN epitaxial layer having a bottom surface disposed on an underlying layer;
   forming grooves through the GaN to expose the underlying layer;
   applying a chemical etchant to the grooves to separate the GaN into a plurality of separate structures;
   removing the separated GaN structures from the underlying layer; and
   contacting the bottom surface of at least one of the separated GaN structures to the diamond substrate;
   wherein the bottom surface of at the least one of the separated GaN structures is bonded to the diamond substrate by Van der Waal forces wherein the diamond substrate is formed by a method comprising:
   polishing a surface of diamond to a first degree of smoothness;
   forming a material over the polished surface to provide an intermediate structure; re-polishing the material formed on the intermediate structure to a second degree of smoothness smoother than the first degree of smoothness.

2. The method recited in claim 1 wherein the formed material is diamond.

3. The method recited in claim 1 wherein the formed material is a thermally conductive oxide.

4. The method recited in claim 1 wherein the formed material is BeO, GaN, MgO, or $SiO_2$.

5. A method for bonding a semiconductor to a heat sink, comprising:
   providing a structure comprising a semiconductor layer having a bottom surface disposed on an underlying layer;
   forming grooves through the semiconductor layer to expose the underlying layer;
   applying a chemical etchant to the grooves to undercut under the bottom surface of the semiconductor layer and along an interface between the bottom surface of the semiconductor layer and the underlying layer to separate the semiconductor layer from the underlying layer and form a plurality of separated semiconductor structures; and contacting the bottom surface of at least one of the separated semiconductor structures to a surface of the heat sink;

wherein the heat sink is diamond; and including contacting the surface of the diamond substrate with a volatile substance disposed between the bottom surface of the at least one separated semiconductor structures and the surface of the diamond substrate.

6. The method recited in claim 5 wherein surface of the diamond substrate and the bottom surface of the at least one separated semiconductor structures are bonded with the volatile substances therebetween.

7. A method for bonding a semiconductor to a heat sink, comprising:

providing a structure comprising a semiconductor layer having a bottom surface disposed on an underlying layer;

forming grooves through the semiconductor layer to expose the underlying layer;

applying a chemical etchant to the grooves to undercut under the bottom surface of the semiconductor layer and along an interface between the bottom surface of the semiconductor layer and the underlying layer to separate the semiconductor layer from the underlying layer and form a plurality of separated semiconductor structures; and contacting the bottom surface of at least one of the separated semiconductor structures to a surface of the heat sink;

wherein a drop of the water is placed between the surface of the heat sink and the bottom surface of the at least one separated semiconductor structures and wherein the surface of the heat sink are bonded together with the drop of water between the surface of the heat sink and the bottom surface of the at least one separated semiconductor structures.

8. A method for bonding a semiconductor to a heat sink, comprising:

providing a structure comprising a semiconductor layer having a bottom surface disposed on an underlying layer;

forming grooves through the semiconductor layer to expose the underlying layer;

applying a chemical etchant to the grooves to undercut under the bottom surface of the semiconductor layer and along an interface between the bottom surface of the semiconductor layer and the underlying layer to separate the semiconductor layer from the underlying layer and form a plurality of separated semiconductor structures; and contacting the bottom surface of at least one of the separated semiconductor structures to a surface of the heat sink wherein the underlying layer is disposed on a support and wherein chemical etchant etches through the exposed underlying layer to the support.

9. The method recited in claim 8 wherein the support comprises sapphire and wherein the underlying layer is an oxide.

10. The method recited in claim 8 wherein the semiconductor layer is GaN.

11. The method recited in claim 8 wherein the semiconductor layer is an epitaxial layer.

12. The method recited in claim 11 wherein the semiconductor layer is GaN.

\* \* \* \* \*